United States Patent [19]

Tomita et al.

[11] Patent Number: 5,623,205

[45] Date of Patent: Apr. 22, 1997

[54] METHOD AND APPARATUS FOR MEASURING A MAGNETIC FIELD USING A MAGNETIC FORCE MICROSCOPE BY MAGNETIZING A PROBE AND CORRECTING A DETECTED MAGNETIC FIELD

[75] Inventors: Eisuke Tomita; Masatoshi Yasutake, both of Tokyo, Japan

[73] Assignee: Seiko Instruments Inc., Japan

[21] Appl. No.: 295,236

[22] Filed: Aug. 24, 1994

[30] Foreign Application Priority Data

Sep. 2, 1993 [JP] Japan ................................. 5-218776

[51] Int. Cl.⁶ .................................................. G01R 33/02
[52] U.S. Cl. ....................... 324/244; 324/244.1; 324/259
[58] Field of Search .................................. 324/228, 244, 324/244.1, 249, 259, 260; 250/306, 307

[56] References Cited

U.S. PATENT DOCUMENTS 5,103,174  4/1992  Wandass et al. .................. 324/262 X
5,266,897  11/1993  Watanuki et al. ..................... 324/244
5,315,247  5/1994  Kaiser et al. ......................... 324/244
5,436,448  7/1995  Hosaka et al. .................... 324/260 X

*Primary Examiner*—Gerald R. Strecker
*Attorney, Agent, or Firm*—Adams & Wilks

[57] ABSTRACT

A magnetic force microscope for measuring a magnetic field near a surface of a magnetic sample includes a cantilever having a ferromagnetic probe at one end thereof and receiving a magnetic force from the surface of the magnetic sample. An oscillation device is fixed to another end of the cantilever for oscillating the cantilever. A voltage application device applies an alternating voltage to the oscillation device. A deflection detecting device detects the oscillation of the cantilever. A magnetic field generating device supplies a magnetic field near the ferromagnetic probe. By this construction, it is possible to correct fluctuations in magnetic field measurements using probes with different magnetic characteristics and magnetic field detecting sensitivity, and to measure an absolute value of the detected magnetic field. Further, since the ferromagnetic probe can be magnetized, it is possible to increase the magnetic sensitivity of the ferromagnetic probe.

18 Claims, 4 Drawing Sheets

METHOD AND APPARATUS FOR MEASURING A MAGNETIC FIELD USING A MAGNETIC FORCE MICROSCOPE BY MAGNETIZING A PROBE AND CORRECTING A DETECTED MAGNETIC FIELD

BACKGROUND OF THE INVENTION

The present invention relates to a magnetic force microscope.

Conventionally, as an apparatus for measuring a local magnetic field on a surface of a magnetic body, there have been used magnetic force microscopes utilizing a leaf spring having a ferromagnetic probe at an end portion thereof. For instance, Appl. Phys. Lett. 57,1820 (1990) discloses such an apparatus.

In these conventional magnetic force microscopes, a magnetic thin film has been formed on a metal probe, or a silicon or nitride silicon probe by sputtering, vacuum deposition or metal plating to be used as a ferromagnetic probe. However, since the magnetic characteristics differ depending on the probe, the sensitivity of the detected magnetic field fluctuates and it has been difficult to measure an absolute value of a detected magnetic field. Further, since the prior art does not include a means for magnetizing the probe, it has been impossible to increase the magnetic sensitivity of the probe.

SUMMARY OF THE INVENTION

In order to solve the above problems, the magnetic force microscope of the present invention uses an apparatus for magnetizing a probe and correcting a detected magnetic field (hereinafter referred to as "a probe magnetizing and detected magnetic field correcting apparatus").comprising: a magnetic field generating device having a solenoid and a magnetic core of high magnetic permeability, and a current source for moving a control current through the magnetic field generating coil to magnetize a probe disposed at one end of a leaf spring and to correct a detected magnetic field.

According to the present invention, a magnetic force microscope for measuring a magnetic field near a surface of a magnetic sample comprises: a leaf spring having a ferromagnetic probe at one end thereof and which receives a magnetic force from the surface of the magnetic sample, a piezoelectric device connected to another end of the leaf spring for oscillating the leaf spring, voltage applying means for applying an alternating voltage to the piezoelectric device, deflection detecting means for detecting deflection of the leaf spring, a magnetic field generating device having a solenoid and a magnetic core of high magnetic permeability, and a current source for supplying a control current through the magnetic field generating coil. By this construction it is possible to correct fluctuations in magnetic field measurements using probes with different magnetic characteristics and magnetic field detecting sensitivity, and to measure an absolute value of the detected magnetic field. Furthermore, since the probe can be magnetized, it is possible to increase the magnetic sensitivity of the probe.

DETAILED DESCRIPTION OF THE PREFERRED EMBODIMENTS

<Structure of the Apparatus>

Figure 1:
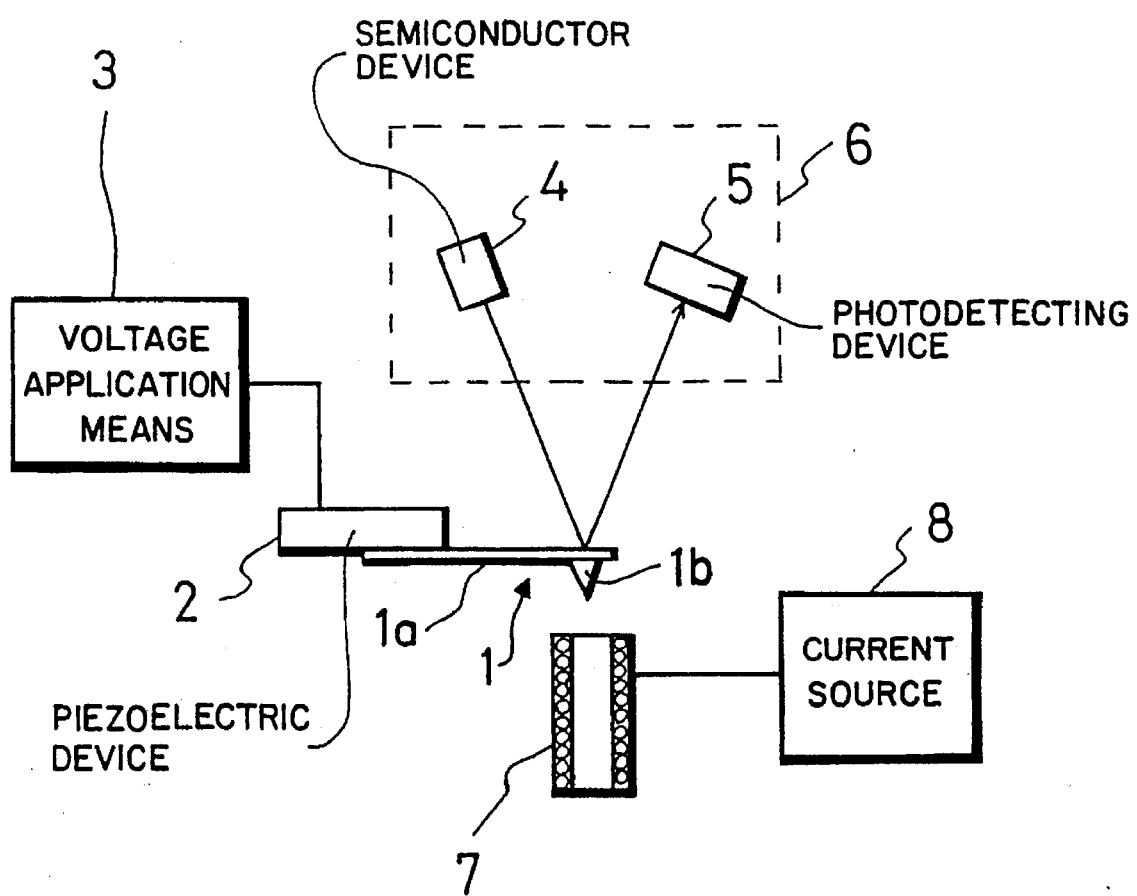
FIG. 1 is a schematic view showing the probe magnetizing and detected magnetic field correcting apparatus of the magnetic force microscope according to the present invention.

FIG. 1 is a schematic view showing a probe magnetizing and detected magnetic field correcting apparatus of the magnetic force microscope according to the present invention. A cantilever 1 comprises a leaf spring 1a having a ferromagnetic probe 1b at one end thereof. The leaf spring 1a is preferably comprised of a silicon material. The ferromagnetic probe 1b preferably comprises a silicon material coated with a thin film of a CoCrPt alloy. Preferably, the leaf spring 1a and the ferromagnetic probe 1b are formed as a unitary body. The ferromagnetic probe 1b and the leaf spring 1a are subjected to a magnetic force from a surface of a magnetic sample (not shown) disposed under the ferromagnetic probe.

A piezoelectric device 2 is fixed to another end of the leaf spring 1a for oscillating the leaf spring 1a. A function generator 3 constitutes a voltage applying means for applying an alternating voltage to the piezoelectric device 2 which, in turn, causes the leaf spring 1a to resonate. A deflection detecting means 6, comprised of a semiconductor laser 4 and a photodetecting device 5 divided into four parts, detects an oscillation state of the leaf spring 1a. A magnetic field coil 7 comprised of a solenoid and a magnetic core of high magnetic permeability is disposed under the ferromagnetic probe 1b and the magnetic sample (not shown). The magnetic field coil 7 generates a magnetic field near the ferromagnetic probe 1b to allow measurement of an absolute value of the magnetic field detected from the surface of the magnetic sample and magnetization of the ferromagnetic probe to increase the magnetic sensitivity of the ferromagnetic probe. A current source 8 supplies a control current to the magnetic field coil 7 to thereby generate the magnetic field. As the magnetic core of high magnetic permeability, a cylindrical permalloy core (an alloy of Fe and N) is preferably used. As the solenoid, 10 turns of copper wire is preferably used.

<Operation Principle>

Figure 2:
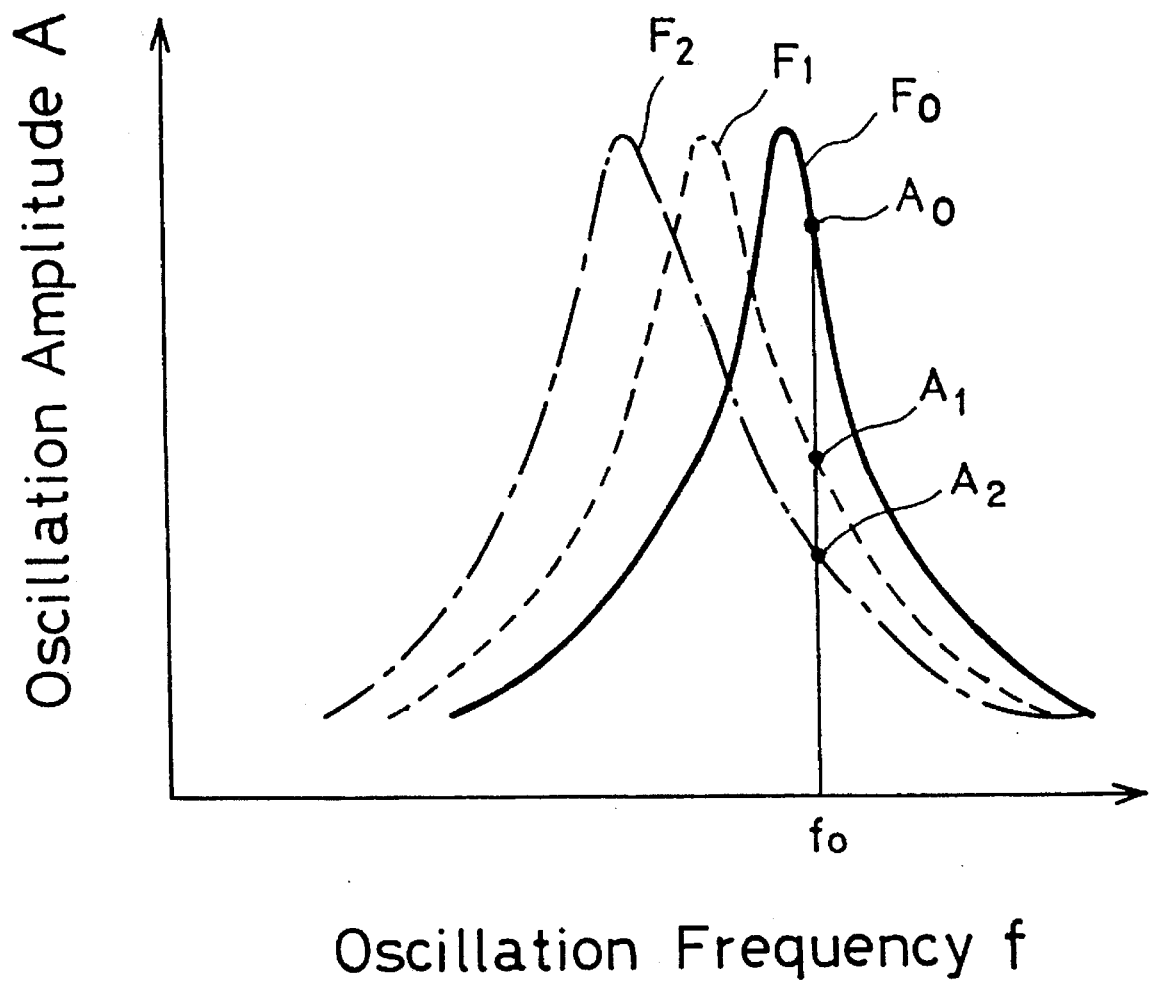
FIG. 2 is a graph showing a relation between the oscillation frequency and the oscillation amplitude of the leaf spring.

FIG. 2 is a graph showing a relation between an oscillation frequency and oscillation amplitude of the leaf spring 1a with the ferromagnetic probe 1b. A horizontal axis denotes the oscillation frequency, and a vertical axis denotes the oscillation amplitude. A curve $F_0$ in solid line shows the resonance characteristic of the leaf spring 1a in a state that is observed when a current does not flow through the magnetic field coil 7 and the leaf spring 1a does not receive a magnetic force from the magnetic field coil 7. When the current source 8 supplies a direct current through the magnetic field coil 7, a magnetic force acts on the leaf spring 1a. The resonance characteristic of the leaf spring 1a in this state is shown by a curve $F_1$ in broken line. Further, if a current which flows through the magnetic field coil 7 is increased to generate a larger magnetic field, a magnetic force acting on the leaf spring 1a increases. The resonance characteristic of the leaf spring 1a in this state is shown by a curve $F_2$ in alternate long and short dash lines.

Next, a change in oscillation amplitude of the leaf spring $1a$ is fixed at $f_0$ shown in FIG. 2. The oscillation amplitude is $A_0$ on the curve $F_0$ when the direct current does not flow through the magnetic field coil 7, $A_1$ on the curve $F_1$ when the direct current flows through the magnetic field coil 7, and $A_2$ on the curve $F_2$ when the direct current flowing through the magnetic field coil 7 is increased.

Figure 3:
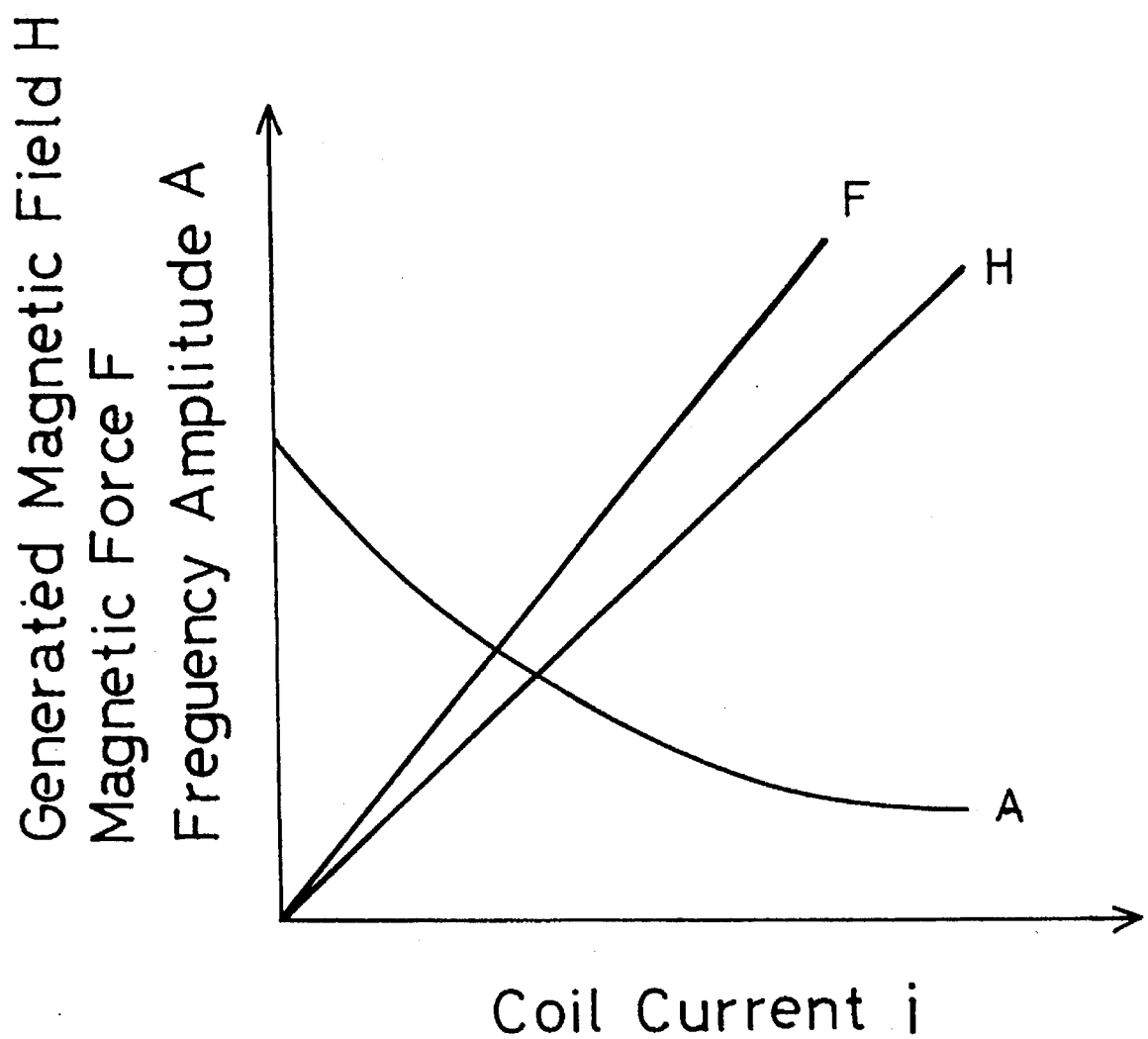
FIG. 3 is a graph showing a relation between the coil current, and the generated magnetic field, the magnetic force, and the oscillation amplitude of the leaf spring, respectively.

FIG. 3 is a graph showing relationships between the coil current, and the generated magnetic field, the magnetic force, and the oscillation amplitude of the leaf spring $1a$, respectively. As shown in FIG. 3, there is a proportional relation between the coil current and the generated magnetic field. When the coil current is i, the number of coil turns is n, the generated magnetic field is H, the permeability of the magnetic core is $\mu$, and the absolute permeability of vacuum is $\mu_0$, then $$H=(\mu/\mu_0)ni \qquad (1)$$

When the magnetic force acting on the leaf spring $1a$ is F, and the intensity of a magnetic moment of the ferromagnetic probe $1b$ is m, $$F=mH \qquad (2)$$

According to equation (1), $$F=m(\mu/\mu_0)ni \qquad (3)$$

Therefore, the magnetic force F is proportional to the coil current as shown in FIG. 3.

If the oscillation amplitude of the leaf spring $1a$ is A, as the magnetic force F increases, the oscillation amplitude A decreases as shown in FIG. 2 and FIG. 3.

As explained above, it is found that the magnetic field H generated by the magnetic field coil 7, the magnetic force F, and the oscillation amplitude A are functions of the coil current i. In other words, if the current i is set, values of the magnetic field H, the magnetic force F, and the amplitude A are determined.

The intensity m of the magnetic moment of the ferromagnetic probe $1b$ is constant in the above explanation, however a value of m actually varies from leaf spring to leaf spring. Therefore, values of the magnetic force F and the amplitude A are dependent on the type of leaf spring selected.

<Method for Correcting Magnetic Force>

When the magnetic field on the surface of the magnetic sample is H', the intensity of the magnetic moment of the probe is m', and the magnetic force is F'. Then, according to equation (2), $$F'=m'H' \qquad (4)$$

Next, after removing the magnetic sample, the leaf spring $1a$ is set above the magnetic field coil 7 and a coil current i' is adjusted so that the magnetic force becomes equivalent to the above F'. Then, according to equation (3), $$F'=m'(\mu/\mu_0)ni' \qquad (5)$$

According to equation (4), the magnetic field H' of the surface of the magnetic sample is:

$$H'=(\mu/\mu_0)ni' \qquad (6)$$

Since the coil current i' is measurable, the magnetic field H' of the surface of the magnetic sample can be obtained from equation (6).

Further, when the permeability $\mu$ of the magnetic core of the magnetic field coil 7 is correctly measured, it is possible to obtain an absolute value of the magnetic field H' of the surface of the magnetic sample by the above measurement.

<Method for Magnetizing Probe>

Figure 4:
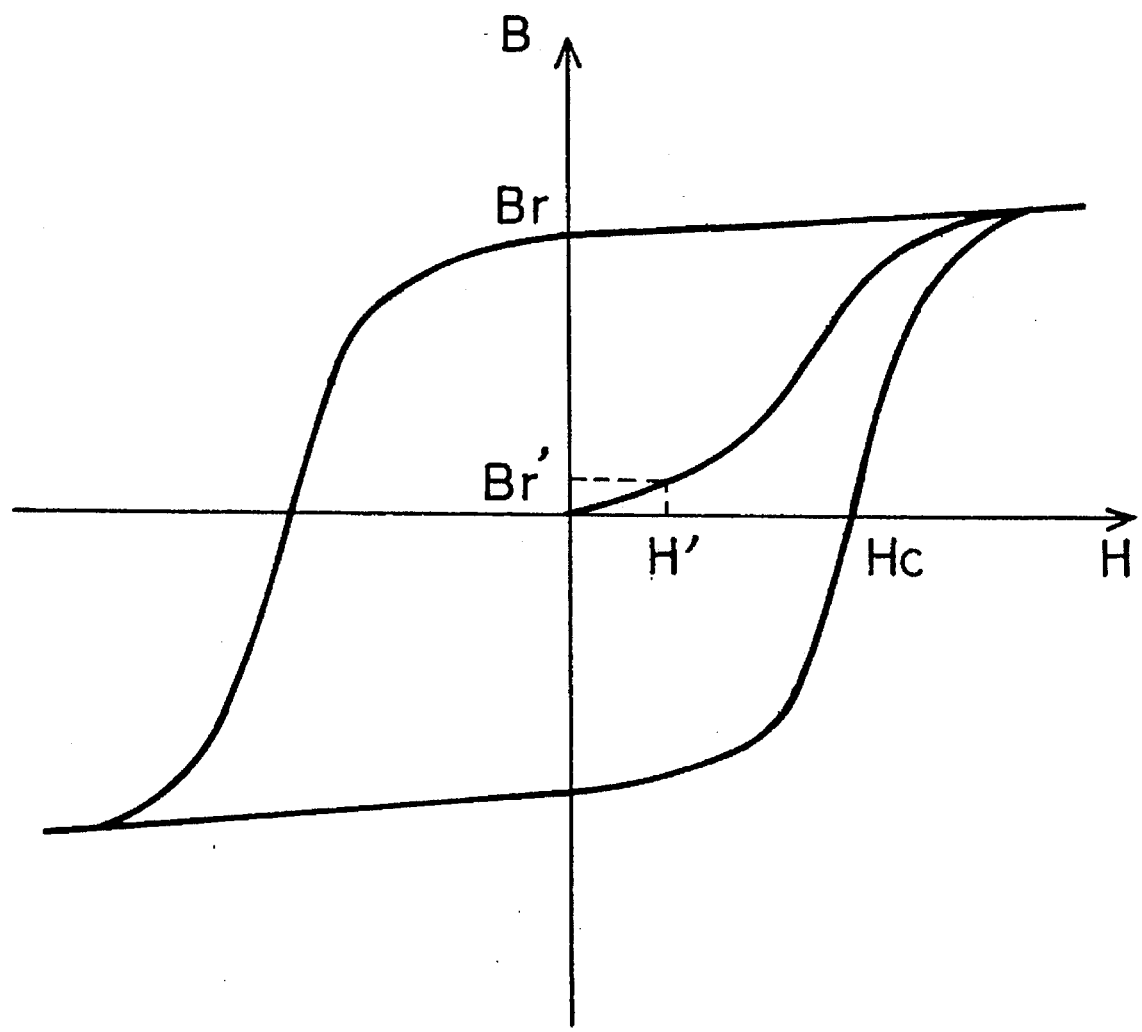
FIG. 4 is a graph showing the magnetic characteristic of the ferromagnetic probe.

FIG. 4 shows magnetic characteristics in a B-H curve of the ferromagnetic probe $1b$ coated with a thin film of a CoCrPt alloy.

In FIG. 4 a horizontal axis denotes the external magnetic field H, and a vertical axis denotes the magnetic flux density B. The magnetic flux density B is saturated by making the external magnetic field H larger than a coercive force Hc. Next, if the magnetic field H is made zero, the magnetic flux density B becomes a value of residual magnetization Br. Provided that an area of a magnetic layer of the ferromagnetic probe $1b$ is s, the intensity m of the magnetic moment of the ferromagnetic probe $1b$ is $$m=Br \cdot s \qquad (7)$$

If the magnetic field of the surface of the magnetic sample is H', then according to equation (2) the magnetic force F is:

$$F=Br \cdot sH' \qquad (8)$$

When the probe $1b$ is not magnetized, the magnetic flux density becomes Br' due to the magnetic field H' of the surface of the magnetic sample as shown in FIG. 4. At this time, the magnetic force F' is:

$$F'=Br' \cdot sH' \qquad (9)$$

Since Br is much larger than Br', F is much larger than F' according to equations (8), (9). Therefore, if the probe $1b$ is magnetized, as the magnetic force increases, the magnetic sensitivity increases.

As the external magnetic field for magnetizing the probe $1b$, there is used a magnetic field that is generated when an alternating current flows through the magnetic field coil 7. The following are values of the number of coil turns n, the permeability of the magnetic core $\mu$ and the absolute permeability of vacuum $\mu_0$, respectively:

| | |
|---|---|
| n=10 | (turns) |
| $\mu$=100 | (H/m) |
| $\mu_0$=0.1257×10$^{-6}$ | (H/m) |

The generated magnetic field H is, according to equation (1), $$H=8.0\times10^7 \times i \qquad (10)$$

provided that the coil current i is 10 mA. Then, according to equation (10):

$$H=8.0\times10^5 \qquad (A/m)$$

The coercive force Hc of the ferromagnetic probe $1b$ is:

$$H=2.0\times10^{15} \qquad (A/m)$$

Since H>>Hc, it is possible to magnetize the probe $1b$.

From the foregoing description, it can be seen that the inventive magnetic force microscope for measuring a magnetic field near a surface of a magnetic sample comprises a leaf spring having a ferromagnetic probe at one end thereof and which receives a magnetic force from the surface of the magnetic sample, a piezoelectric device connected to another end of the leaf spring for oscillating the leaf spring, voltage applying means for applying an alternating voltage to the piezoelectric device, deflection detecting means for detecting deflection of the leaf spring, a magnetic field generating device having a solenoid and a magnetic core of high magnetic permeability, and a current source for supplying a control current to the magnetic field generating coil. By this construction, it is possible to correct fluctuations in magnetic field detecting sensitivity and to measure an absolute value of the detected magnetic field, which measurement has been impossible to obtain in the prior art. Furthermore, it becomes possible to magnetize the probe, thereby increasing the magnetic sensitivity of the probe.

What claimed is:

1. A magnetic force microscope for measuring a magnetic field near a surface of a magnetic sample, the magnetic force microscope comprising: a cantilever having a ferromagnetic probe at an end portion thereof and receiving a magnetic force from the surface of the magnetic sample during use of the magnetic force microscope; oscillation means for oscillating the cantilever; voltage applying means for applying an alternating voltage to the oscillation means; deflection detecting means for detecting an oscillation state of the cantilever; magnetic field generating means for generating a magnetic field near the ferromagnetic probe to allow measurement of an absolute value of the magnetic field on the surface of the magnetic sample and magnetization of the ferromagnetic probe to increase the magnetic sensitivity of the ferromagnetic probe; and current supply means for supplying a control current to the magnetic field generating means.

2. A method for measuring a magnetic field near a surface of a magnetic sample, comprising the steps of: providing a magnetic force microscope which includes a leaf spring having a ferromagnetic probe at a first end thereof and receiving a magnetic force from the surface of the magnetic sample, a piezoelectric device supporting a second end of the leaf spring for oscillating the leaf spring, voltage applying means for applying an alternating voltage to the piezoelectric device, deflection detecting means for detecting a deflection of the leaf spring, a magnetic field generating coil provided under the leaf spring and having a solenoid and a magnetic core of high magnetic permeability for generating a magnetic field near the ferromagnetic probe, and a current source for supplying a control current to the magnetic field generating coil; measuring a magnetic force acting on the leaf spring in a state where a control current is not supplied to the magnetic field generating coil by measuring the oscillation amplitude of the leaf spring which is oscillated by the piezoelectric device; removing the magnetic sample from the magnetic force microscope; allowing the current source to supply a control current to the magnetic field generating coil to generate a magnetic force equivalent to the measured magnetic force; and measuring the magnetic field on the surface of the magnetic sample from a value of the control current supplied to the magnetic field generating coil.

3. A method for magnetizing a ferromagnetic probe, comprising the steps of: providing a magnetic force microscope including a leaf spring having the ferromagnetic probe at an end portion thereof and receiving magnetic force from a surface of a magnetic sample, a piezoelectric device supporting a second end of the leaf spring for oscillating the leaf spring, voltage applying means for applying an alternating voltage to the piezoelectric device, deflection detecting means for detecting a deflection of the leaf spring, a magnetic field generating coil provided under the leaf spring and having a solenoid and a magnetic core of high magnetic permeability for generating a magnetic field near the ferromagnetic probe; supplying a control current to the magnetic field generating coil to apply an external magnetic field to the ferromagnetic probe which is greater than a coercive force of the ferromagnetic probe to saturate the ferromagnetic probe with a magnetic flux density; and stopping the supply of the control current to the magnetic field generating coil to make the external magnetic field zero.

4. A magnetic force microscope for measuring a magnetic field on a surface of a magnetic sample, the magnetic force microscope comprising:

a leaf spring having a ferromagnetic probe at a first end thereof and receiving a magnetic force from the surface of the magnetic sample during use of the magnetic force microscope;

a piezoelectric device supporting a second end of the leaf spring for oscillating the leaf spring;

voltage applying means for applying an alternating voltage to the piezoelectric device;

deflection detecting means for detecting a deflection of the leaf spring indicative of an oscillation state of the leaf spring;

a magnetic field generating coil for generating a magnetic field near the ferromagnetic probe to allow measurement of an absolute value of the magnetic field on the surface of the magnetic sample and magnetization of the ferromagnetic probe to increase the magnetic sensitivity of the ferromagnetic probe, the magnetic field generating coil comprising a solenoid and a magnetic core of high magnetic permeability; and a current source for supplying a control current to the magnetic field generating coil.

5. A magnetic force microscope for measuring a magnetic field on a surface of a magnetic sample, the magnetic force microscope comprising:

a leaf spring having a ferromagnetic probe at a first end thereof and receiving a magnetic force from the surface of the magnetic sample during use of the magnetic force microscope;

a piezoelectric device supporting a second end of the leaf spring for oscillating the leaf spring;

voltage applying means for applying an alternating voltage to the piezoelectric device;

deflection detecting means for detecting a deflection of the leaf spring indicative of an oscillation state of the leaf spring;

a magnetic field generating coil for generating a magnetic field near the ferromagnetic probe to allow measurement of an absolute value of the magnetic field on the surface of the magnetic sample and magnetization of the ferromagnetic probe to increase the magnetic sensitivity of the ferromagnetic probe, the magnetic field generating coil being disposed under the leaf spring and the ferromagnetic probe; and a current source for supplying a control current to the magnetic field generating coil.

6. A magnetic force microscope as claimed in claim 1; wherein the ferromagnetic probe is comprised of a silicon material coated with a thin film of a CoCrPt alloy.

7. A magnetic force microscope as claimed in claim 1; wherein the cantilever comprises a leaf spring supporting the ferromagnetic probe at one end thereof and fixed to the oscillation means at another end thereof.

8. A magnetic force microscope as claimed in claim 7; wherein the leaf spring and the ferromagnetic probe comprise a single unitary body.

9. A magnetic force microscope as claimed in claim 7; wherein the leaf spring is comprised of a silicon material.

10. A magnetic force microscope as claimed in claim 1; wherein the magnetic field generating means comprises a solenoid and a magnetic core of high magnetic permeability.

11. A magnetic force microscope as claimed in claim 1; wherein the deflection detecting means comprises a laser and a photodetecting device.

12. A magnetic force microscope as claimed in claim 1; wherein the magnetic field generating means is disposed under the cantilever and the ferromagnetic probe.

13. A magnetic force microscope as claimed in claim 1; where the magnetic field generating means is spaced from the leaf spring and the ferromagnetic probe.

14. A magnetic force microscope for measuring a magnetic field on a surface of a magnetic sample, the magnetic force microscope comprising:

- a leaf spring having a ferromagnetic probe at a first end thereof and receiving a magnetic force from the surface of the magnetic sample during use of the magnetic force microscope;
- a piezoelectric device supporting a second end of the leaf spring for oscillating the leaf spring;
- voltage applying means for applying an alternating voltage to the piezoelectric device;
- deflection detecting means for detecting a deflection of the leaf spring indicative of an oscillation state of the leaf spring;
- a magnetic field generating coil for generating a magnetic field near the ferromagnetic probe to allow measurement of an absolute value of the magnetic field on the surface of the magnetic sample and magnetization of the ferromagnetic probe to increase the magnetic sensitivity of the ferromagnetic probe, the magnetic field generating coil being spaced from the leaf spring and the ferromagnetic probe; and
- a current source for supplying a control current to the magnetic field generating coil.

15. A method for measuring a magnetic field near a surface of a magnetic sample disposed in the vicinity of a cantilever having a ferromagnetic probe, comprising the steps of: measuring a magnetic force acting on the cantilever; removing the magnetic sample from the vicinity of the ferromagnetic probe; providing a magnetic field generating device near the ferromagnetic probe; supplying a control current to the magnetic field generating device to generate a magnetic force equivalent to the measured magnetic force; and measuring the magnetic field at the surface of the magnetic sample from a value of the control current supplied to the magnetic field generating device.

16. A method for magnetizing a ferromagnetic probe disposed at one end of a cantilever in a magnetic force microscope, comprising the steps of: providing a magnetic field generating device near the ferromagnetic probe; supplying a control current to the magnetic field generating device to apply an external magnetic field to the magnetic probe which is greater than a coercive force of the ferromagnetic probe to saturate the ferromagnetic probe with a magnetic flux density; and stopping the supply of the control current to the magnetic field generating device.

17. A method as claimed in claim 16; wherein the providing step includes providing the magnetic field generating device at a distance from the cantilever.

18. A method as claimed in claim 16; wherein the providing step includes providing the magnetic field generating device under the ferromagnetic probe.

* * * * *